(12) United States Patent
Tsai et al.

(10) Patent No.: US 8,629,046 B2
(45) Date of Patent: Jan. 14, 2014

(54) SEMICONDUCTOR DEVICE WITH A DISLOCATION STRUCTURE AND METHOD OF FORMING THE SAME

(75) Inventors: Chun Hsiung Tsai, Xinpu Township, Hsinchu County (TW); Tsan-Chun Wang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 4 days.

(21) Appl. No.: 13/177,309

(22) Filed: Jul. 6, 2011

(65) Prior Publication Data

US 2013/0009216 A1    Jan. 10, 2013

(51) Int. Cl.
*H01L 21/28* (2006.01)
*H01L 21/22* (2006.01)

(52) U.S. Cl.
USPC ............. 438/542; 438/585; 257/E21.135; 257/E21.19

(58) Field of Classification Search
None
See application file for complete search history.

(56) References Cited

U.S. PATENT DOCUMENTS

| | | | |
|---|---|---|---|
| 2005/0224867 A1* | 10/2005 | Huang et al. | 257/327 |
| 2007/0254461 A1* | 11/2007 | Wei et al. | 438/514 |
| 2008/0020591 A1* | 1/2008 | Balseanu et al. | 438/761 |
| 2009/0001371 A1* | 1/2009 | Mowry et al. | 257/51 |
| 2009/0079008 A1* | 3/2009 | Nandakumar et al. | 257/377 |

OTHER PUBLICATIONS

Chi-Ming Wu and Chun-Feng Nieh, U.S. Appl. No. 12/713,735, filed Feb. 26, 2010 for "High Temperature Implantation method for Stressor Formation," 13 pages of text, 5 pages of drawings.

\* cited by examiner

*Primary Examiner* — Seahvosh Nikmanesh
(74) *Attorney, Agent, or Firm* — Haynes and Boone, LLP

(57) ABSTRACT

A semiconductor device with bi-layer dislocation and method of fabricating the semiconductor device is disclosed. The exemplary semiconductor device and method for fabricating the semiconductor device enhance carrier mobility. The method includes providing a substrate having a gate stack. The method further includes performing a first pre-amorphous implantation process on the substrate and forming a first stress film over the substrate. The method also includes performing a first annealing process on the substrate and the first stress film. The method further includes performing a second pre-amorphous implantation process on the annealed substrate, forming a second stress film over the substrate and performing a second annealing process on the substrate and the second stress film.

9 Claims, 16 Drawing Sheets

SEMICONDUCTOR DEVICE WITH A DISLOCATION STRUCTURE AND METHOD OF FORMING THE SAME

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as semiconductor devices, such as a metal-oxide-semiconductor field-effect transistors (MOSFETs), are scaled down through various technology nodes, strained source/drain features (e.g., stressor regions) have been implemented to enhance carrier mobility and improve device performance. Although existing approaches to forming stressor regions for IC devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
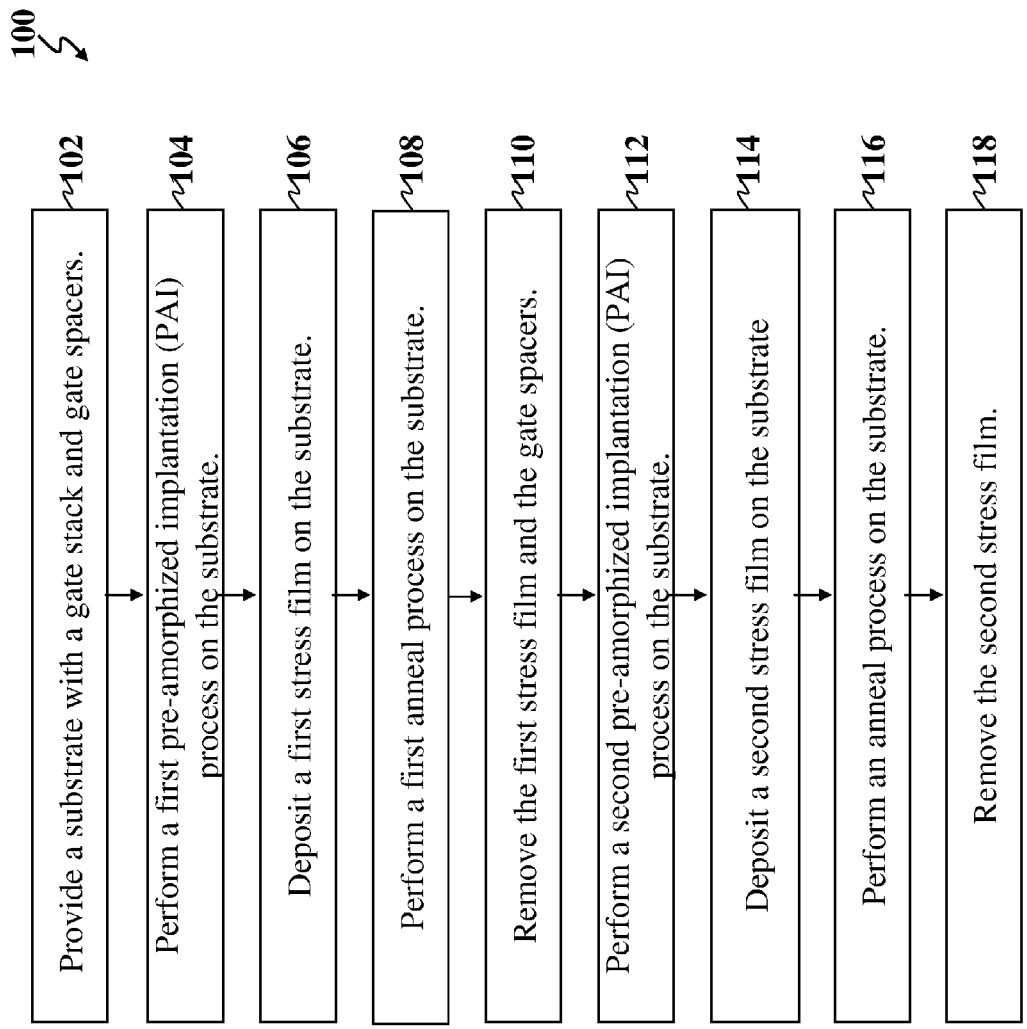
FIG. 1 is a flowchart illustrating a method of forming a semiconductor device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It is understood that those skilled in the art will be able to devise various equivalents that, although not explicitly described herein, embody the principles of the present invention.

Examples of devices that can benefit from one or more embodiments of the present invention are semiconductor devices with field effect transistors (FET). Such a device, for example, is a complementary metal-oxide-semiconductor (CMOS) field effect transistor. The following disclosure will continue with this example to illustrate various embodiments of the present invention. It is understood, however, that the invention should not be limited to a particular type of device, except as specifically claimed.

With reference to FIGS. 1 and 2-8, a method 100 and a semiconductor device 200 are collectively described below. The semiconductor device 200 illustrates an integrated circuit, or portion thereof, that can comprise active devices such as metal-oxide-semiconductor field effect transistors (MOSFETs), complementary metal-oxide-semiconductor (CMOS) transistors, high voltage transistors, and/or high frequency transistors; other suitable components; and/or combinations thereof. The semiconductor device 200 may additionally include passive components, such as resistors, capacitors, inductors, and/or fuses. It is understood that the semiconductor device 200 may be formed by CMOS technology processing, and thus some processes are not described in detail herein. Additional steps can be provided before, during, and after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Referring to FIG. 1, a method 100 for fabricating a semiconductor device is described according to various aspects of the present disclosure. The method 100 begins with step 102 in which a substrate is provided. The substrate includes a gate stack and gate spacers. The method 100 continues with step 104 in which a first pre-amorphous implantation (PAI) process is performed on the substrate. The method 100 continues at step 106 in which a first stress film is deposited on the substrate. The method 100 continues at step 108 in which a first anneal process is performed on the substrate. The method 100 continues at step 110 in which the first stress film and the gate spacers are removed. The method 100 continues at step 112 in which a second pre-amorphous implantation (PAI) process is performed on the substrate. The method 100 continues at step 114 in which a second stress film is deposited on the substrate. The method 100 continues at step 116 in which a second anneal process is performed on the substrate. The method 100 continues at step 118 in which the second stress film is removed. The discussion that follows illustrates various embodiments of a semiconductor device 200 that can be fabricated according to the method 100 of FIG. 1.

Figure 2:
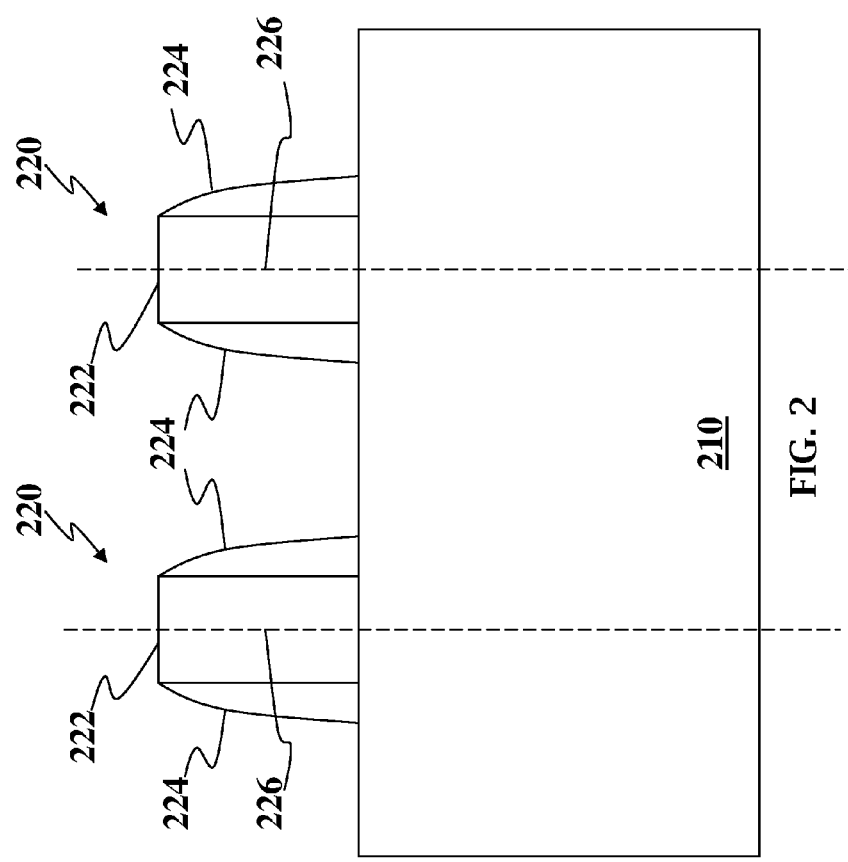
FIGS. 2 to 8 illustrate diagrammatic cross-sectional side views of one embodiment of a semiconductor device at various stages of fabrication according to the method of FIG. 1.

FIGS. 2 to 8 illustrate diagrammatic cross-sectional side views of one embodiment of a semiconductor device 200 at various stages of fabrication according to the method 100 of FIG. 1. Referring to FIG. 2, the semiconductor device 200 includes a substrate 210. In the present embodiment, the substrate 210 is a semiconductor substrate including silicon. Alternatively, the substrate 210 includes an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Where the substrate 210 is an alloy semiconductor, the alloy semiconductor substrate could have a gradient SiGe feature in which the Si and Ge composition change from one ratio at one location to another ratio at another location of the gradient SiGe feature. The alloy SiGe could be formed over a silicon substrate, and/or the SiGe substrate may be strained. In yet another alternative, the semiconductor substrate could be a semiconductor on insulator (SOI).

The substrate 210 includes various doped regions depending on design requirements as known in the art (e.g., p-type wells or n-type wells). The doped regions are doped with p-type dopants, such as boron or $BF_2$, and/or n-type dopants, such as phosphorus or arsenic. The doped regions may be formed directly on the substrate 210, in a P-well structure, in an N-well structure, in a dual-well structure, or using a raised structure. The doped regions include various active regions, such as regions configured for an N-type metal-oxide-semiconductor transistor (referred to as an NMOS) and regions configured for a P-type metal-oxide-semiconductor transistor (referred to as a PMOS).

The substrate 210 can include an isolation region to define and isolate various active regions of the substrate 210. The isolation region utilizes isolation technology, such as shallow trench isolation (STI) or local oxidation of silicon (LOCOS), to define and electrically isolate the various regions. The isolation region includes silicon oxide, silicon nitride, silicon oxynitride, other suitable materials, or combinations thereof.

With further reference to FIG. 2, the substrate 210 includes a gate structure 220 disposed over a channel region. The substrate 210 may further include a source region and a drain region on both sides of the gate structure 220, the channel region being the region between the source region and the drain region. The gate structure 220 includes various gate material layers. In the present embodiment, the gate structure 220 includes a gate stack 222 (also referred to as a gate electrode) and gate spacers 224 disposed on sidewalls of the gate stack 222. The gate structure 220 has a center line 226 which dissects the gate structure 220 into two substantially equal halves.

The gate stack 222 is formed over the substrate 210 to a suitable thickness. In an example, the gate stack 222 is a polycrystalline silicon (or polysilicon) layer. The polysilicon layer may be doped for proper conductivity. Alternatively, the polysilicon is not necessarily doped, for example, if a dummy gate is to be formed and later replaced by a gate replacement process. In another example, the gate stack 222 is a conductive layer having a proper work function, therefore, the gate stack 222 can also be referred to as a work function layer. The work function layer includes a suitable material, such that the layer can be tuned to have a proper work function for enhanced performance of the device. For example, if a P-type work function metal (P-metal) for a PMOS device is desired, TiN or TaN may be used. On the other hand, if an N-type work function metal (N-metal) for an NMOS device is desired, Ta, TiAl, TiAlN, or TaCN, may be used. The work function layer could include doped conducting oxide materials. The gate stack 222 could include other conductive materials, such as aluminum, copper, tungsten, metal alloys, metal silicide, other suitable materials, and/or combinations thereof. The gate stack 222 could include multiple layers. For example, where the gate stack 222 includes a work function layer, another conductive layer can be formed over the work function layer. The gate stack 222 is formed by chemical vapor deposition (CVD), physical vapor deposition (PVD), atomic layer deposition (ALD), high density plasma CVD (HDPCVD), plating, other suitable methods, and/or combinations thereof.

The gate spacers 224 are formed over the substrate 210 by any suitable process to any suitable thickness. The gate spacers 224 include a dielectric material, such as silicon nitride, silicon oxide, silicon oxynitride, other suitable materials, and/or combinations thereof. The gate spacers 224 can be used to offset subsequently formed doped regions, such as heavily doped source/drain regions.

Figure 3:
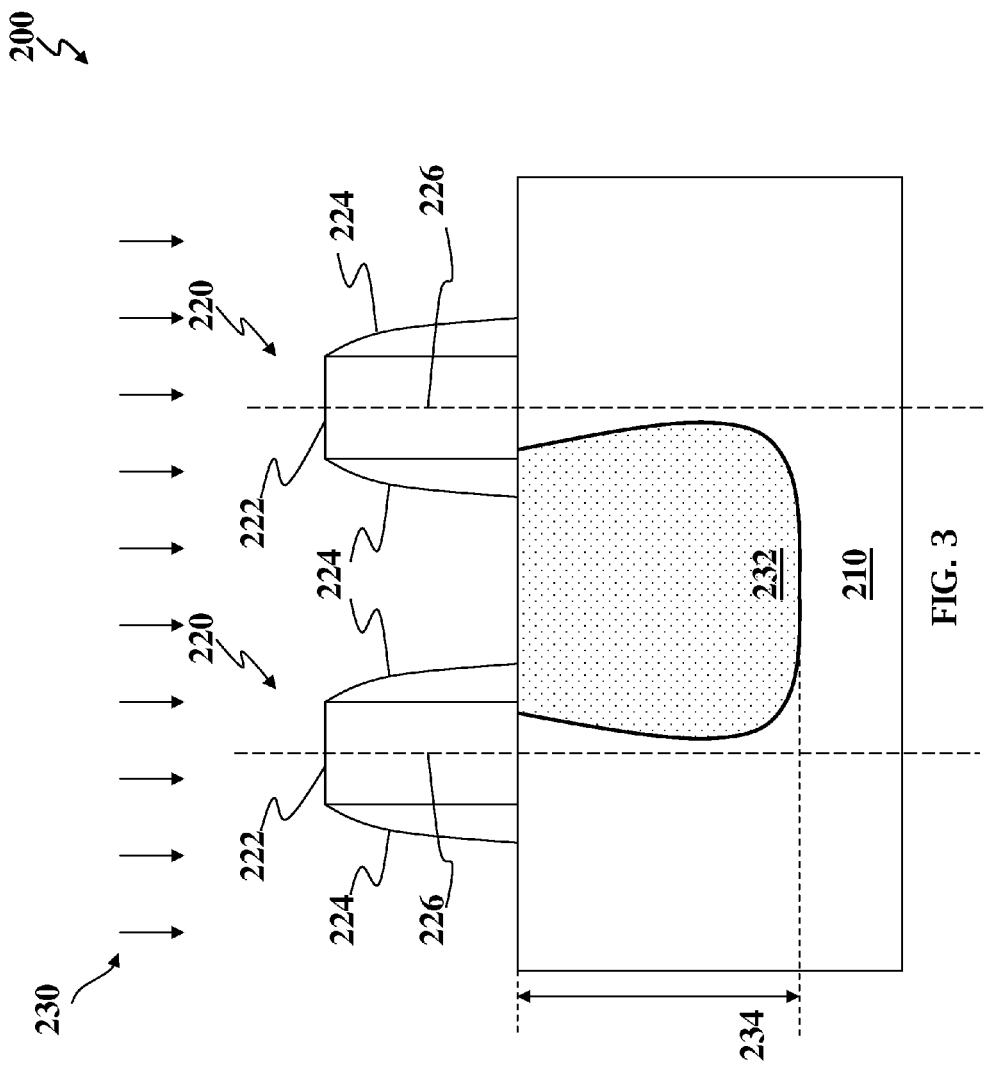

Referring to FIG. 3, a first pre-amorphous implantation (PAI) process 230 is performed on the substrate 210. The first PAI process 230 implants the substrate 210, damaging the lattice structure of the substrate 210 and forming a first amorphized region 232. In the present embodiment, the first amorphized region 232 is formed in a source and drain region of the semiconductor device 200 and does not extend beyond the center line 226 of the gate structure 220. The first amorphized region 232 has a depth 234. The first amorphized depth 234 is formed according to design specifications. The first amorphized depth 234 may range from about 10 to about 150 nanometers. In the present embodiment, the first amorphized depth 234 is less than about 100 nanometers. The first amorphized depth 234 can be controlled by the thickness of the gate spacers 224, because the gate spacers 224 serve to concentrate the first PAI process 230 implantation energy away from the center line 226 of the gate structure 220; thereby allowing for a deeper amorphized depth 234. Also, the first amorphized depth 234 can be controlled by the first PAI process 230 implant energy, implant species, and/or implant dosage. The first PAI process 230 implants the substrate 210 with silicon (Si) or germanium (Ge). Alternatively, the first PAI process 230 could utilize other implant species, such as Ar, Xe, $BF_2$, As, In, other suitable implant species, or combinations thereof. In the present embodiment, the first PAI process 230 implants Si or Ge at an implant energy from about 20 KeV to about 60 KeV, and a dosage ranging from about $1 \times 10^{14}$ atoms/cm$^2$ to about $2 \times 10^{15}$ atoms/cm$^2$, depending on the implantation temperature. Lower implantation temperature will enhance implant amorphization efficiency.

A patterned photoresist layer may be utilized to define where the first amorphized region 232 is formed and protect other regions of the semiconductor device 200 from implantation damage. For example, the patterned photoresist layer exposes the source/drain regions, such that the source/drain regions are exposed to the first PAI process 230 (forming amorphized region 232) while the gate structure 220 (and other portions of the semiconductor device 200) are protected from the first PAI process 230. Alternatively, a patterned hard mask layer, such as a SiN or SiON layer, is utilized to define the amorphized region. The patterned photoresist layer or the patterned hard mask layer may be part of the current manufacturing process (e.g., LDD or source/drain formation), thereby minimizing cost as no additional photoresist layer or hard mask is required for the first PAI process 230.

Figure 4:
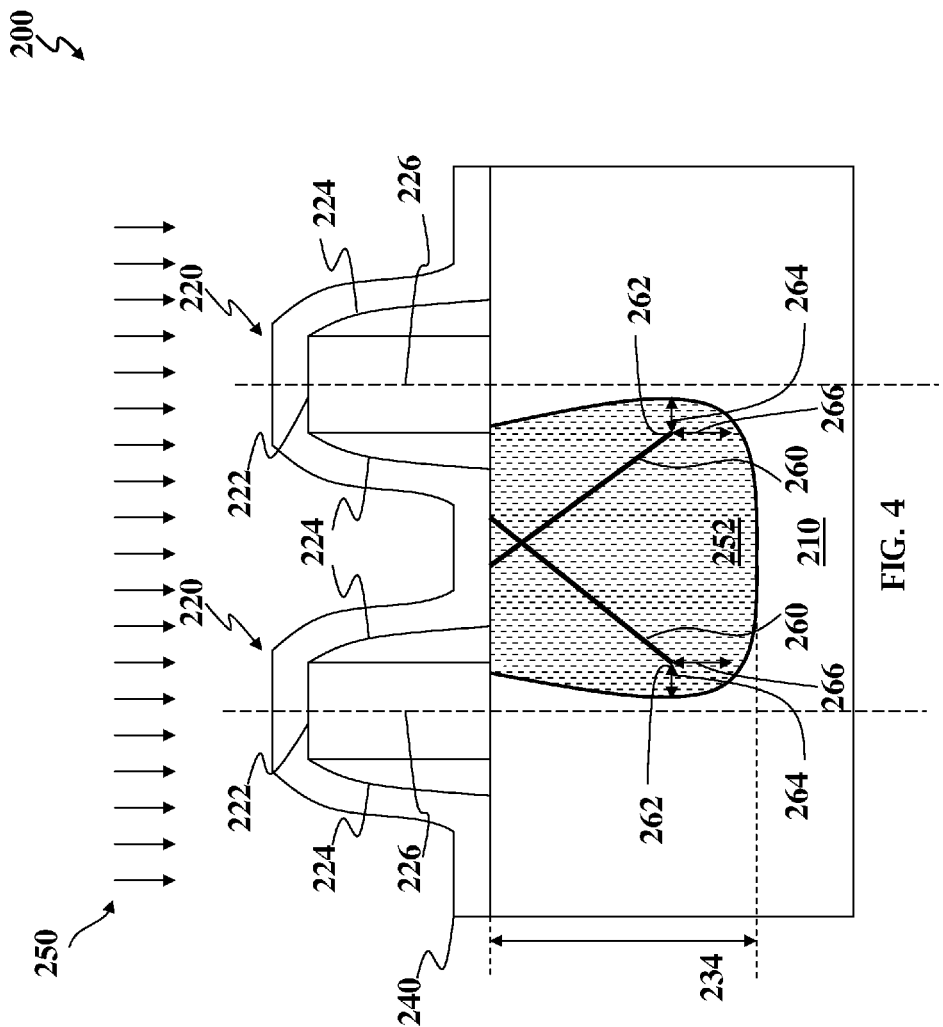

Referring to FIG. 4, a first stress film 240 is deposited over the substrate 210. The first stress film 240 may be formed by chemical vapor deposition (CVD), physical vapor deposition (PVD), atomic layer deposition (ALD), high density plasma CVD (HDPCVD), plating, other suitable methods, and/or combinations thereof. The first stress film 240 may include a dielectric material, such as silicon nitride, silicon oxide, silicon oxynitride, other suitable materials, and/or combinations thereof. The first stress film 240 is used to provide stress in a subsequent first annealing process 250 which recrystallizes the first amorphized region 232.

Still referring to FIG. 4, a first annealing process 250 is performed on the substrate 210. The first annealing process 250 causes the first amorphized region 232 to re-crystallize, forming a first stressor region 252. This process is often referred to as solid-phase epitaxy (SPE), and thus, the first stressor region 252 may be referred to as epi regions. The first stressor region 252 could be, for example, implant or epitaxial SiP stressor region, or implant or epitaxial SiC stressor region. The first annealing process 250 is a rapid thermal annealing (RTA) process or a millisecond thermal annealing (MSA) process (for example, a millisecond laser thermal annealing process).

The annealing process may include a long range pre-heat which minimizes or even eliminates end of range (EOR) defects. The long range pre-heat may be performed at a temperature from about 200° C. to about 700° C. The long range pre-heat may be performed for about 50 to about 300 seconds. The first annealing process 250 may be performed at a temperature from about 500° C. to about 1,400° C. Also, depending on the type of annealing process and the temperature utilized, the first annealing process 250 may be performed for about 1 millisecond to about 5 seconds. In the present embodiment, the long range pre-heat has a temperature of about 550° C. for about 180 seconds. Also, in the present embodiment, the first annealing process 250 is a RTA process, utilizing a temperature greater than about 1000° C. and is performed for more than 1.5 seconds. In an embodiment, the first annealing process 250 is a MSA process, utilizing a temperature up to a Si melting point of about 1,400° C. and is performed for a few milliseconds or less, for example for about 0.8 milliseconds to about 100 milliseconds.

During the first annealing process 250, as the substrate 210 recrystallizes, first dislocations 260 are formed in the first stressor region 252. The first dislocations 260 are formed in the 111 direction. The 111 direction has an angle of about 45 to about 65 degrees, the angle being measured with respect to an axis parallel to a surface of the substrate 210. In the present embodiment, the first dislocations 260 have a 111 direction with an angle of about 55 degrees, the angle being measured with respect to an axis parallel to the surface of the substrate 210.

The first dislocations 260 start formation at first pinchoff points 262. The first pinchoff points 262 are formed in the first stressor region 252 at a depth of about 10 to about 150 nanometers, the depth being measured from the surface of the substrate 210. The first pinchoff points 262 have a horizontal buffer 264 and a vertical buffer 266. The horizontal buffer 264 and the vertical buffer 266 are formed according to design specifications and are a function of the first annealing process 250. The first pinchoff points 262 have a horizontal buffer 264 of about 5 to about 20 nanometers and a vertical buffer 266 of about 10 to about 40 nanometers. The first pinchoff points 262 may be formed such that they are not disposed within the channel region. In the present embodiment, the first pinchoff points 262 have a horizontal buffer 264 of about 10 nanometers and a vertical buffer 266 of about 30 nanometers, and are formed at a depth of about 70 nanometers.

Figure 5:
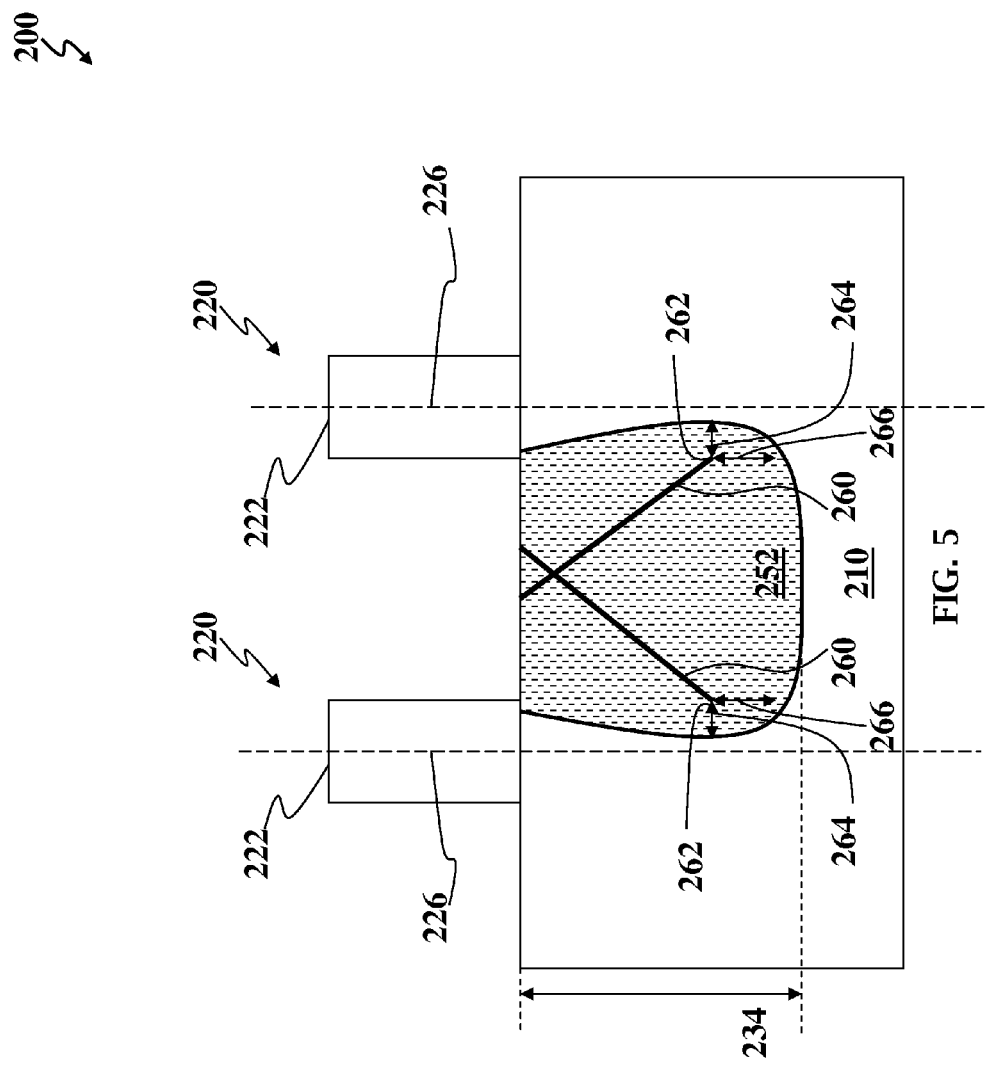

Referring to FIG. 5, the first stress film 240 is removed from the substrate 210. Also, the gate spacers 224 are removed from the gate structure 220. The first stress film 240 and the gate spacers 224 are removed by a conventional etching process. The conventional etching process may be performed by wet etching using phosphoric acid or hydrofluoric acid, or by dry etching using suitable etchant.

Figure 6:
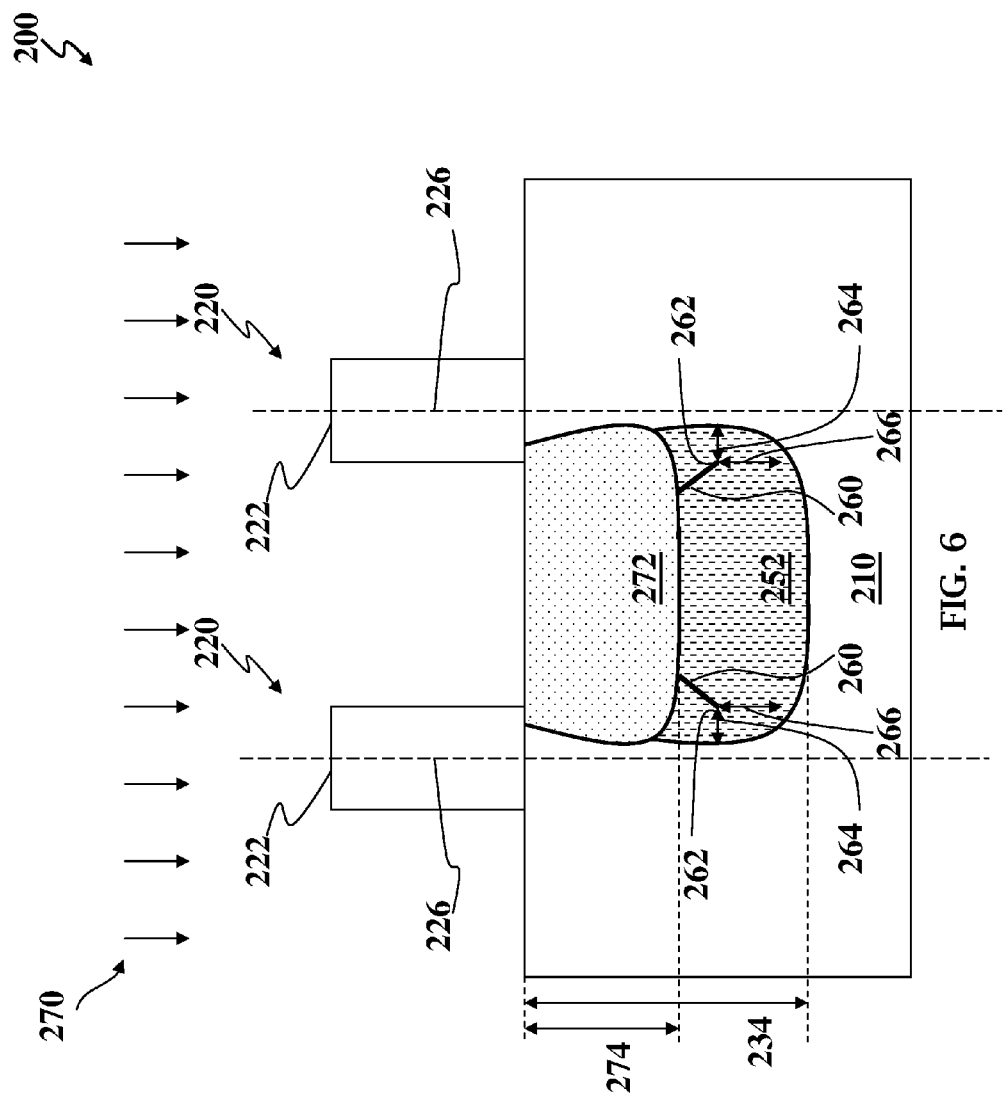

Referring to FIG. 6, a second pre-amorphous implantation (PAI) process 270 is performed on the substrate 210. The second PAI process 270 implants the substrate 210, damaging the lattice structure of the substrate 210 and forming a second amorphized region 272. In the present embodiment, the second amorphized region 272 is formed in a source and drain region of the semiconductor device 200 and does not extend beyond the center line 226 of the gate structure 220. Also, the second amorphized region 272 is formed in a portion of the first stressor region 252, thereby partially or completely eliminating the first dislocations 260 within the second amorphized region 272.

The second amorphized region 272 has a depth 274. The second amorphized depth 274 is formed according to design specifications. The second amorphized depth 274 may range from about 10 to about 150 nanometers. In the present embodiment, the second amorphized depth 274 is less than about 50 nanometers. The second amorphized depth 274 can be controlled by the second PAI process 270 implant energy, implant species, and/or implant dosage. The second PAI process 270 implants the substrate 210 with silicon (Si) or germanium (Ge). Alternatively, the second PAI process 270 could utilize other implant species, such as Ar, Xe, $BF_2$, As, In, other suitable implant species, or combinations thereof. In the present embodiment, the second PAI process 270 implants Si or Ge at an implant energy from about 20 KeV to about 60 KeV, and a dosage ranging from about $1\times10^{14}$ atoms/cm$^2$ to about $2\times10^{15}$ atoms/cm$^2$.

A patterned photoresist layer may be utilized to define where the second amorphized region 272 is formed and protect other regions of the semiconductor device 200 from implantation damage. For example, the patterned photoresist layer exposes the source/drain regions, such that the source/drain regions are exposed to the second PAI process 270 (forming amorphized region 232) while the gate structure 220 (and other portions of the semiconductor device 200) are protected from the second PAI process 270. Alternatively, a patterned hard mask layer, such as a SiN or SiON layer, is utilized to define the stressor region. The patterned photoresist layer or the patterned hard mask layer may be part of the current manufacturing process (e.g., LDD or source/drain formation), thereby minimizing cost as no additional photoresist layer or hard mask is required for the second PAI process 270.

In the present embodiment, the first PAI process 230 is substantially similar to the second PAI process 270. In alternative embodiments, the first PAI process 230 is different than the second PAI process 270.

Figure 7:
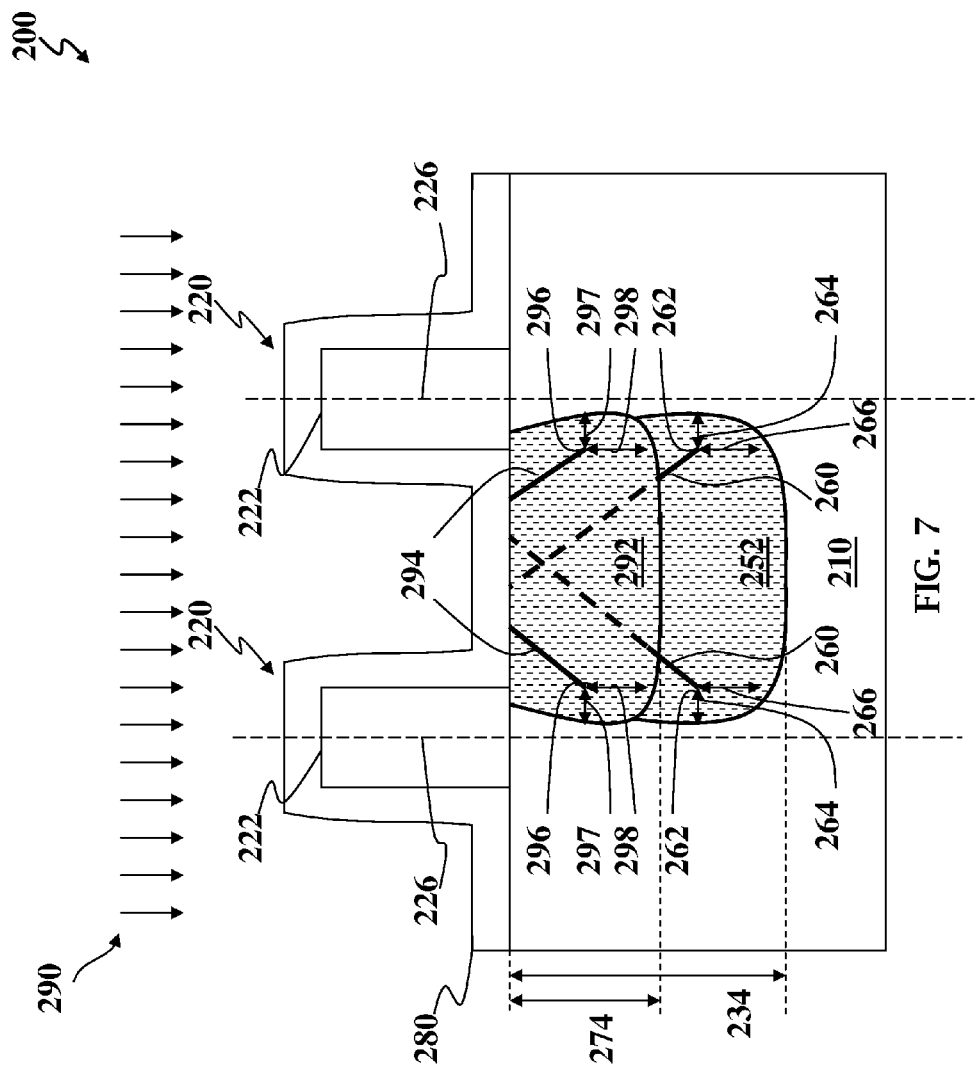

Referring to FIG. 7, a second stress film 280 is deposited over the substrate 210. The second stress film 280 may be formed by chemical vapor deposition (CVD), physical vapor deposition (PVD), atomic layer deposition (ALD), high density plasma CVD (HDPCVD), plating, other suitable methods, and/or combinations thereof. The second stress film 280 may include a dielectric material, such as silicon nitride, silicon oxide, silicon oxynitride, other suitable materials, and/or combinations thereof. The second stress film 280 is used to provide stress in a subsequent second annealing process 290 which recrystallizes the second amorphized region 272.

Still referring to FIG. 7, a second annealing process 290 is performed on the substrate 210. The second annealing process 290 causes the second amorphized region 272 to re-crystallize, forming a second stressor region 292. This process is often referred to as solid-phase epitaxy (SPE), and thus, the second stressor region 292 may be referred to as epi regions. The second stressor region 292 could be, for example, implant/epitaxial SiP region and implant/epitaxial SiC stressor region. The second annealing process 290 is a rapid thermal annealing (RTA) process or a millisecond thermal annealing (MSA) process (for example, a millisecond laser thermal annealing process).

The annealing process may include a long range pre-heat which minimizes or even eliminates end of range (EOR)

defects. The long range pre-heat may be performed at a temperature from about 200° C. to about 700° C. The long range pre-heat may be performed for about 50 to about 300 seconds. The second annealing process 290 may be performed at a temperature from about 500° C. to about 1,400° C. Also, depending on the type of annealing process and the temperature utilized, the second annealing process 290 may be performed for about 1 millisecond to about 5 seconds. In the present embodiment, the long range pre-heat has a temperature of about 550° C. for about 180 seconds. Also, in the present embodiment, the second annealing process 290 is a RTA process, utilizing a temperature greater than about 1000° C. and is performed for more than 1.5 seconds. In an embodiment, the second annealing process 290 is a MSA process, utilizing a temperature up to a Si melting point of about 1,400° C. and is performed for a few milliseconds or less, for example for about 0.8 milliseconds to about 100 milliseconds. In the present embodiment, the first annealing process 250 is substantially similar to the second annealing process 290. In alternative embodiments, the first annealing process 250 is different than the second annealing process 290.

During the second annealing process 290, as the substrate 210 recrystallizes, second dislocations 294 are formed in the second stressor region 292. Also, as the substrate 210 recrystallizes, the first dislocations 260 reform within the second stressor region 292. Thus, the first dislocations 260 extend from the first stress region 252 through the second stress region 292. Accordingly, there are bi-layer dislocations within the substrate 210. The reformation of the first dislocations 260 utilize the first dislocations 260, within the first stressor region 252, as a seed. The second dislocations 294 are formed in the 111 direction. The 111 direction has an angle of about 45 to about 65 degrees, the angle being measured with respect to an axis parallel to a surface of the substrate 210. In the present embodiment, the second dislocations 294 have a 111 direction with an angle of about 55 degrees, the angle being measured with respect to an axis parallel to the surface of the substrate 210. The second dislocations 294 may be formed such that they are substantially parallel to the first dislocations 260.

The second dislocations 294 start formation at second pinchoff points 296. The second pinchoff points 296 are formed in the second stressor region 292 at a depth of about 10 to about 150 nanometers, the depth being measured from the surface of the substrate 210. The second pinchoff points 296 have a horizontal buffer 297 and a vertical buffer 298. The horizontal buffer 297 and the vertical buffer 298 are formed according to design specifications and are a function of the second annealing process 290. The second pinchoff points 296 have a horizontal buffer 297 of about 5 to about 20 nanometers and a vertical buffer 298 of about 10 to about 40 nanometers. The second pinchoff points 296 may be formed such that they are not disposed within the channel region. In the present embodiment, the second pinchoff points 296 have a horizontal buffer 297 of about 10 nanometers and a vertical buffer 298 of about 30 nanometers, and are formed at a depth of about 20 nanometers.

Figure 8:
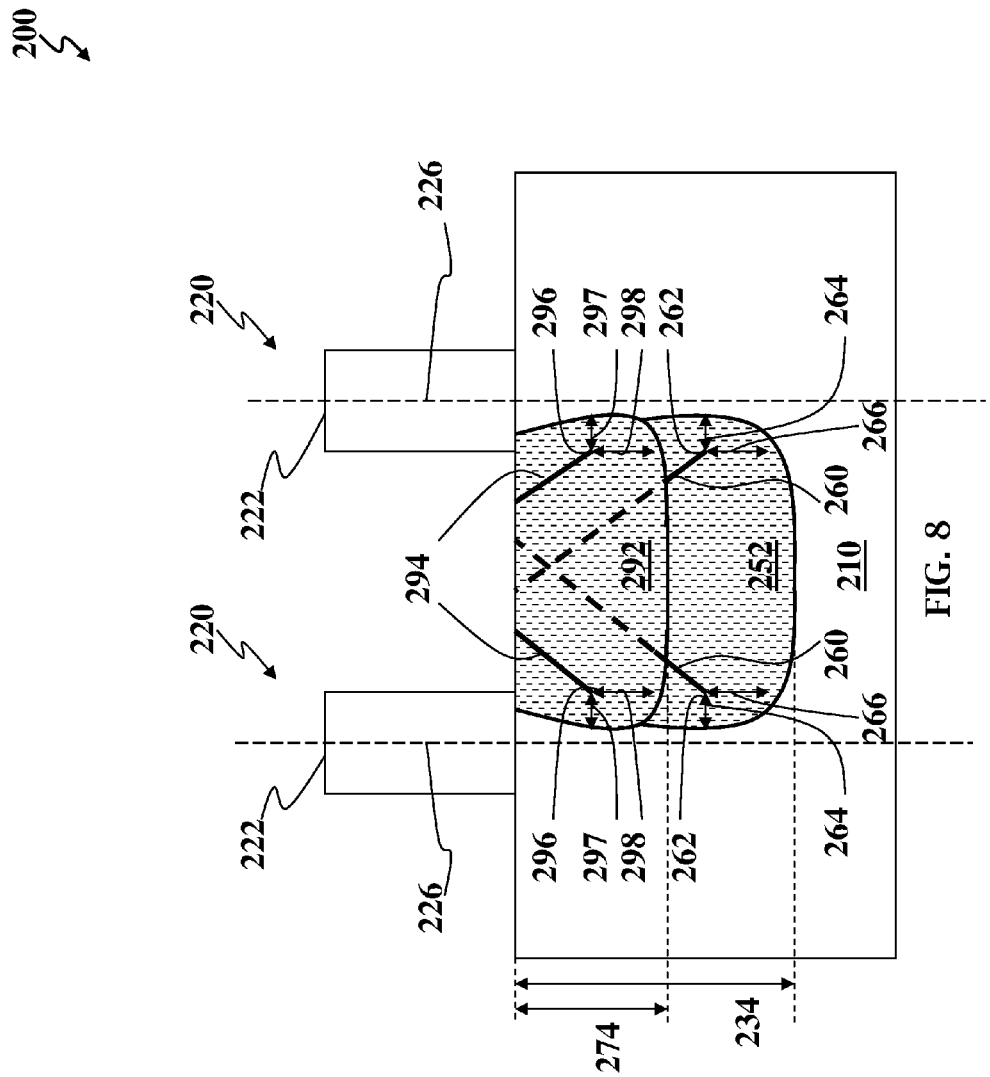

Referring to FIG. 8, the second stress film 280 is removed from the substrate 210. The second stress film 280 is removed by a conventional etching process. The conventional etching process may be performed by wet etching using phosphoric acid or hydrofluoric acid or by dry etching using suitable etchant.

The foregoing embodiment of method 100 may include similar process steps as an embodiment of method 500 which is disclosed below. In disclosing the embodiment of method 500, some details regarding processing and/or structure may be skipped for simplicity if they are similar to those described in the embodiment of method 100. Also, the embodiment of FIGS. 10-16 is similar in many respects to the embodiment of FIGS. 2-8. Accordingly, similar features in FIGS. 2-8 and FIGS. 10-16 are identified by the same reference numerals for clarity and simplicity.

Figure 9:
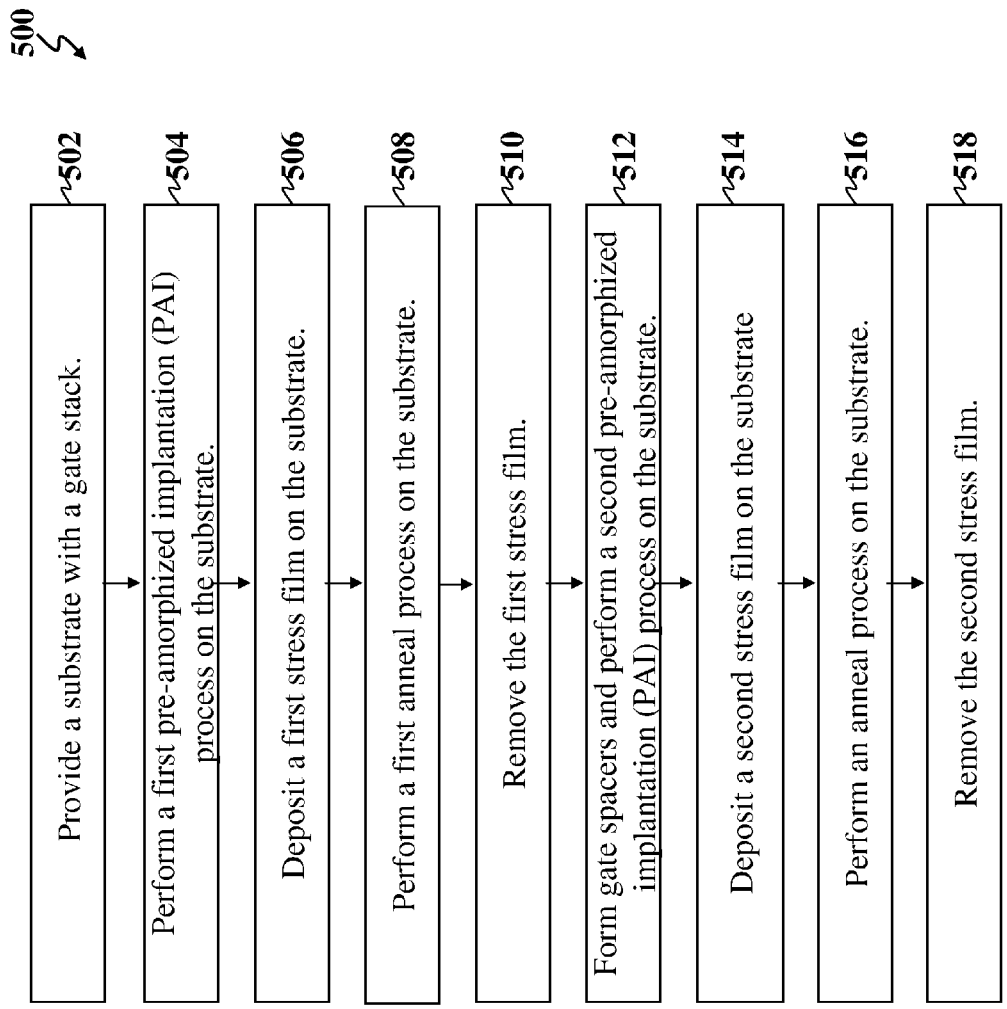
FIG. 9 is a flowchart illustrating a method of forming a semiconductor device according to various aspects of the present disclosure.

Referring to FIG. 9, a method 500 for fabricating a semiconductor device is described according to various aspects of the present disclosure. The method 500 begins with step 502 in which a substrate is provided. The substrate includes a gate stack. The method 500 continues with step 504 in which a first pre-amorphous implantation (PAI) process is performed on the substrate. The method 500 continues at step 506 in which a first stress film is deposited on the substrate. The method 500 continues at step 508 in which a first anneal process is performed on the substrate. The method 500 continues at step 510 in which the first stress film is removed. The method 500 continues at step 512 in which gate spacers are formed and a second pre-amorphous implantation (PAI) process is performed on the substrate. The method 500 continues at step 514 in which a second stress film is deposited on the substrate. The method 500 continues at step 516 in which a second anneal process is performed on the substrate. The method 500 continues at step 518 in which the second stress film is removed. In certain embodiments the gate spacers may also be removed at step 518. The discussion that follows illustrates various embodiments of a semiconductor device 600 that can be fabricated according to the method 500 of FIG. 9.

Figure 10:
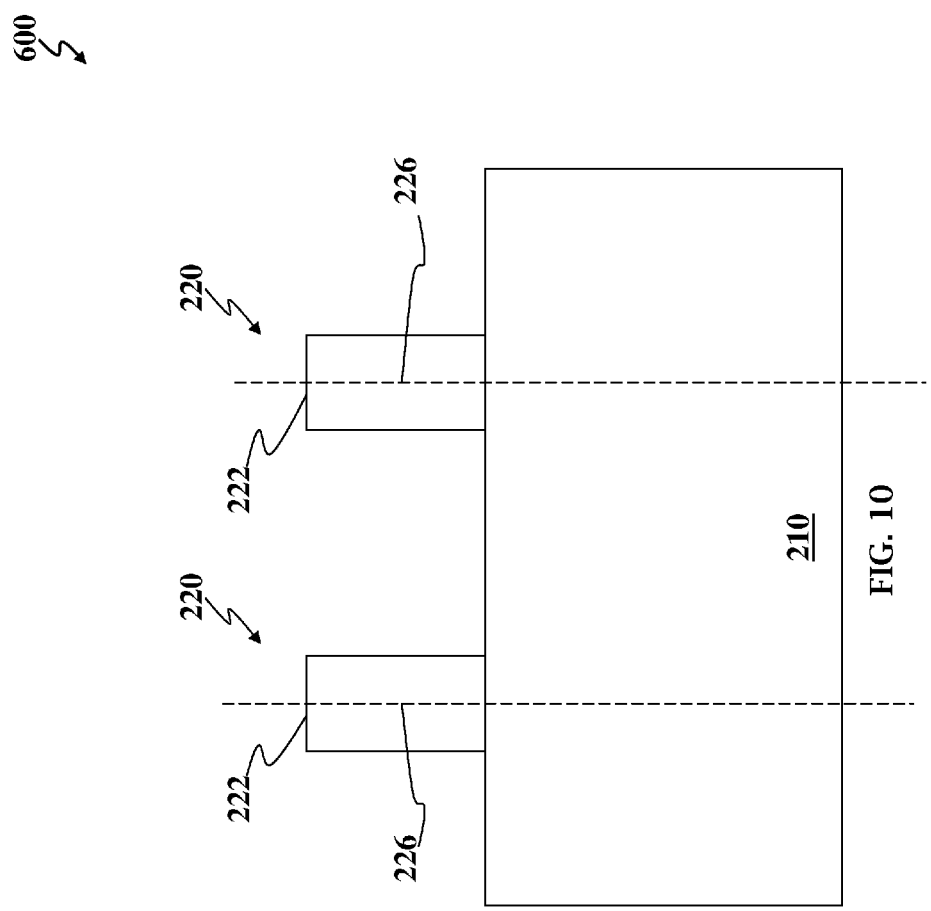
FIGS. 10 to 16 illustrate diagrammatic cross-sectional side views of one embodiment of a semiconductor device at various stages of fabrication according to the method of FIG. 9.

FIGS. 10 to 16 illustrate diagrammatic cross-sectional side views of one embodiment of a semiconductor device 600 at various stages of fabrication according to the method 500 of FIG. 9. Referring to FIG. 10, the semiconductor device 600 includes a substrate 210. The substrate 210 includes a gate structure 220 disposed over a channel region. The substrate 210 may further include a source region and a drain region on both sides of the gate structure 220, the channel region being the region between the source region and the drain region. The gate structure 220 includes various gate material layers. In the present embodiment, the gate structure 220 includes a gate stack 222 (also referred to as a gate electrode). The gate structure 220 has a center line 226 which dissects the gate structure 220 into two substantially equal halves.

Figure 11:
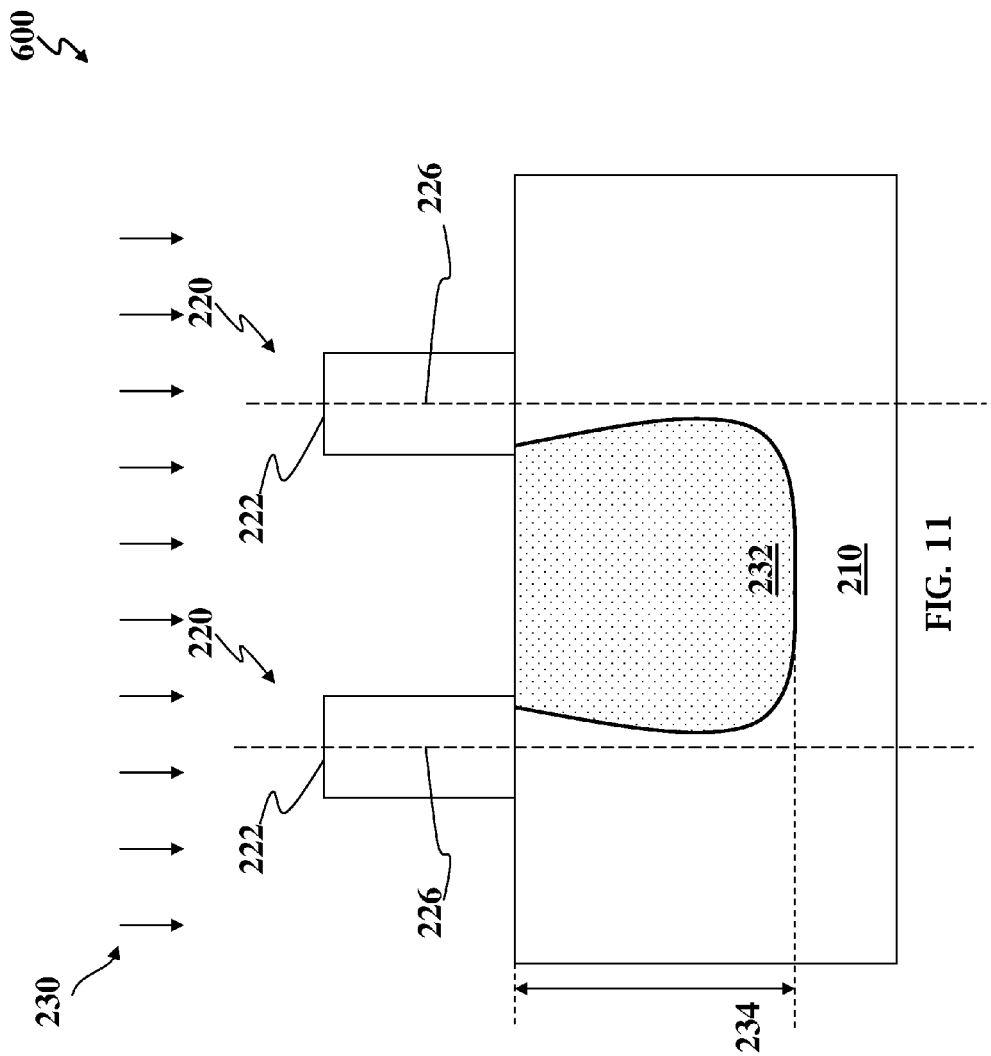

Referring to FIG. 11, a first pre-amorphous implantation (PAI) process 230 is performed on the substrate 210. The first PAI process 230 implants the substrate 210, damaging the lattice structure of the substrate 210 and forming a first amorphized region 232. In the present embodiment, the first amorphized region 232 is formed in a source and drain region of the semiconductor device 200 and does not extend beyond the center line 226 of the gate structure 220. The first amorphized region 232 has a depth 234. The first amorphized depth 234 is formed according to design specifications. The first amorphized depth 234 may range from about 10 to about 150 nanometers. In the present embodiment, the first amorphized depth 234 is less than about 100 nanometers. The first amorphized depth 234 can be controlled by the first PAI process 230 implant energy, implant species, and/or implant dosage. The first PAI process 230 implants the substrate 210 with silicon (Si) or germanium (Ge). Alternatively, the first PAI process 230 could utilize other implant species, such as Ar, Xe, $BF_2$, As, In, other suitable implant species, or combinations thereof. In the present embodiment, the first PAI process 230 implants Si or Ge at an implant energy from about 20 KeV to about 60 KeV, and a dosage ranging from about $1\times10^{14}$ atoms/$cm^2$ to about $2\times10^{15}$ atoms/$cm^2$.

Figure 12:
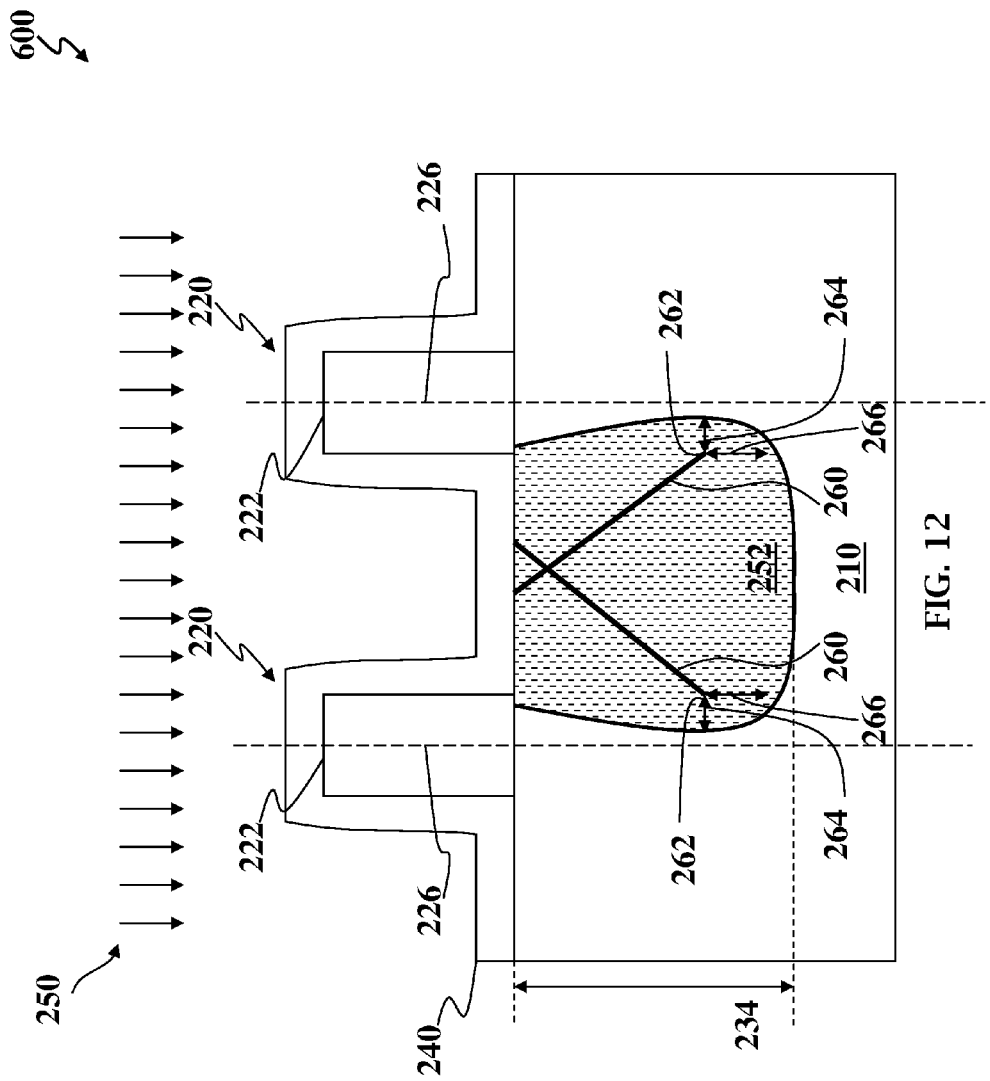

Referring to FIG. 12, a first stress film 240 is deposited over the substrate 210. The first stress film 240 may include a dielectric material, such as silicon nitride, silicon oxide, silicon oxynitride, other suitable materials, and/or combinations thereof. The first stress film 240 is used to provide stress in a subsequent first annealing process 250 which recrystallizes the first amorphized region 232.

Still referring to FIG. 12, a first annealing process 250 is performed on the substrate 210. The first annealing process 250 causes the first amorphized region 232 to re-crystallize, forming a first stressor region 252. The annealing process may include a long range pre-heat which minimizes or even eliminates end of range (EOR) defects. In the present embodiment, the long range pre-heat has a temperature of about 550° C. for about 180 seconds. Also, in the present embodiment, the first annealing process 250 is a RTA process, utilizing a temperature greater than about 1000° C. and is performed for more than 1.5 seconds. In an embodiment, the first annealing process 250 is a MSA process, utilizing a temperature up to a Si melting point of about 1,400° C. and is performed for a few milliseconds or less, for example for about 0.8 milliseconds to about 100 milliseconds.

During the first annealing process 250, as the substrate 210 recrystallizes, first dislocations 260 are formed in the first stressor region 252. The first dislocations 260 are formed in the 111 direction. The 111 direction has an angle of about 45 to about 65 degrees, the angle being measured with respect to an axis parallel to a surface of the substrate 210. In the present embodiment, the first dislocations 260 have a 111 direction with an angle of about 55 degrees, the angle being measured with respect to an axis parallel to the surface of the substrate 210.

The first dislocations 260 start formation at first pinchoff points 262. The first pinchoff points 262 are formed in the first stressor region 252 at a depth of about 10 to about 150 nanometers, the depth being measured from the surface of the substrate 210. The first pinchoff points 262 have a horizontal buffer 264 and a vertical buffer 266. The horizontal buffer 264 and the vertical buffer 266 are formed according to design specifications and are a function of the first annealing process 250. The first pinchoff points 262 have a horizontal buffer 264 of about 5 to about 20 nanometers and a vertical buffer 266 of about 10 to about 40 nanometers. The first pinchoff points 262 may be formed such that they are not disposed within the channel region. In the present embodiment, the first pinchoff points 262 have a horizontal buffer 264 of about 10 nanometers and a vertical buffer 266 of about 30 nanometers, and are formed at a depth of about 70 nanometers.

Figure 13:
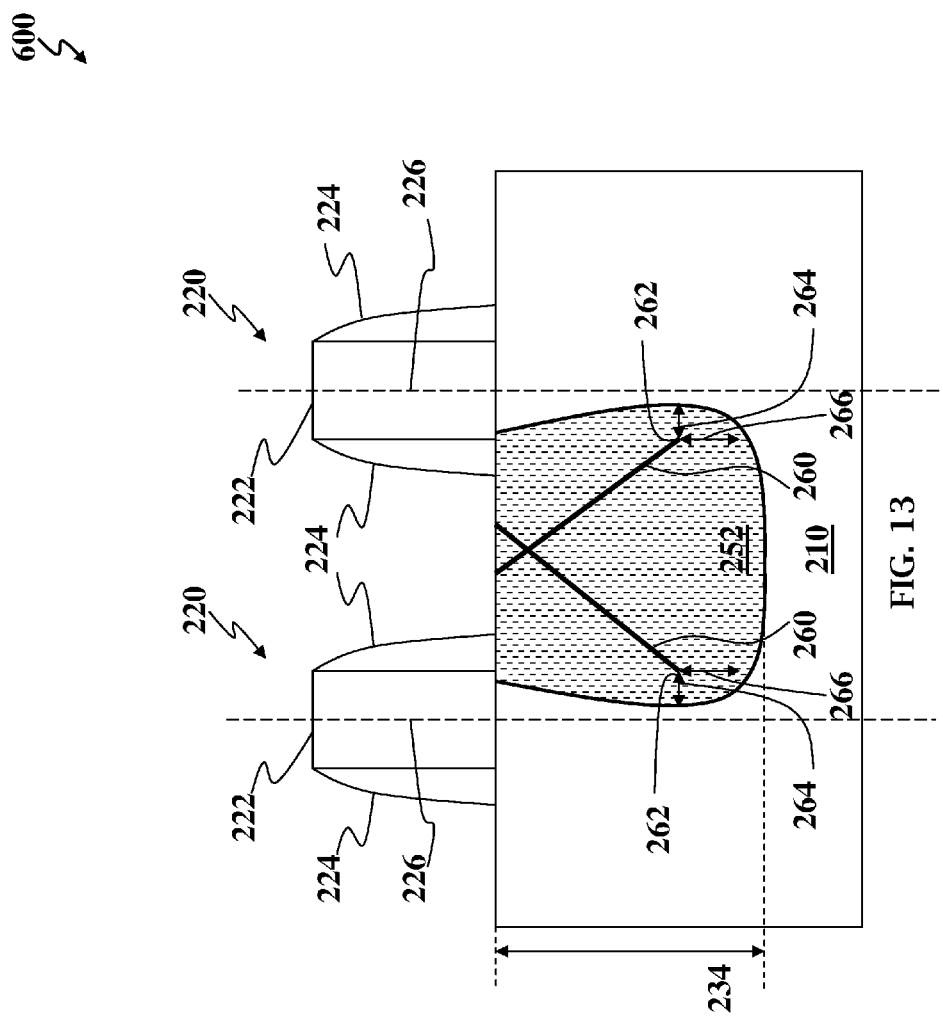

Referring to FIG. 13, the first stress film 240 is removed from the substrate 210. Also, gate spacers 224 are formed on the sidewalls of the gate stack 222 of the gate structure 220.

Figure 14:
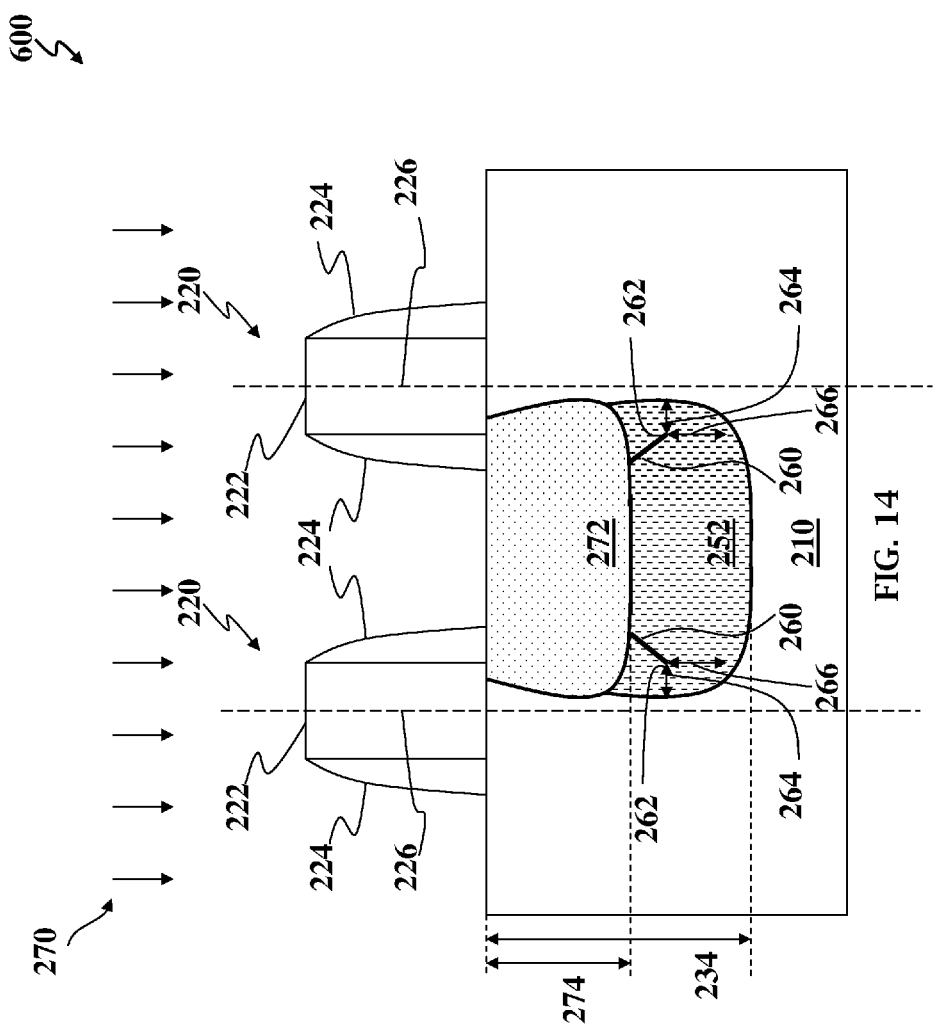

Referring to FIG. 14, a second pre-amorphous implantation (PAI) process 270 is performed on the substrate 210. The second PAI process 270 implants the substrate 210, damaging the lattice structure of the substrate 210 and forming a second amorphized region 272. In the present embodiment, the second amorphized region 272 is formed in a source and drain region of the semiconductor device 200 and does not extend beyond the center line 226 of the gate structure 220. Also, the second amorphized region 272 is formed in a portion of the first stressor region 252, thereby partially or completely eliminating the first dislocations 260 within the second amorphized region 272.

The second amorphized region 272 has a depth 274. The second amorphized depth 274 is formed according to design specifications. The second amorphized depth 274 may range from about 10 to about 150 nanometers. In the present embodiment, the second amorphized depth 274 is less than about 50 nanometers. The second amorphized depth 274 can be controlled by the second PAI process 270 implant energy, implant species, and/or implant dosage. In the present embodiment, the second PAI process 270 implants Si or Ge at an implant energy from about 20 KeV to about 60 KeV, and a dosage ranging from about $1 \times 10^{14}$ atoms/cm$^2$ to about $2 \times 10^{15}$ atoms/cm$^2$. In the present embodiment, the first PAI process 230 is substantially similar to the second PAI process 270. In alternative embodiments, the first PAI process 230 is different than the second PAI process 270.

Figure 15:
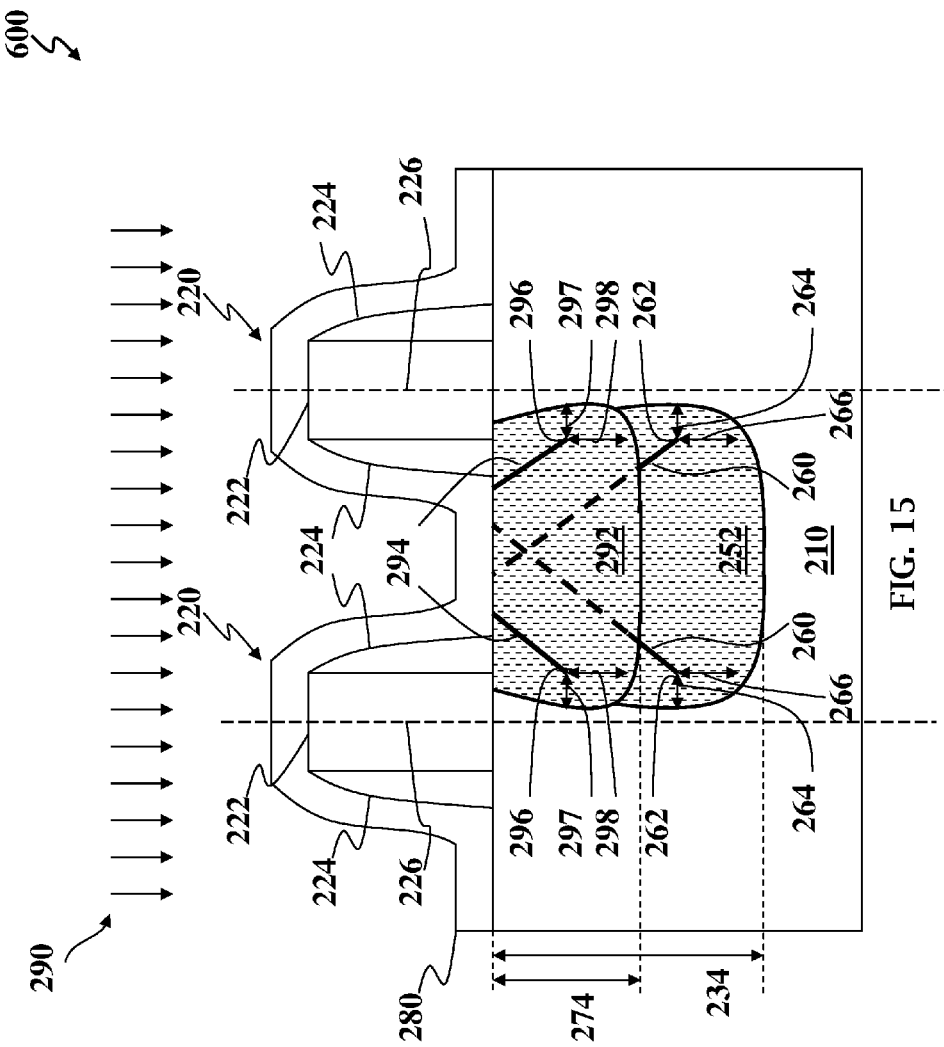

Referring to FIG. 15, a second stress film 280 is deposited over the substrate 210. The second stress film 280 is used to provide stress in a subsequent second annealing process 290 which recrystallizes the second amorphized region 272.

Still referring to FIG. 15, a second annealing process 290 is performed on the substrate 210. The second annealing process 290 causes the second amorphized region 272 to re-crystallize, forming a second stressor region 292. The annealing process may include a long range pre-heat which minimizes or even eliminates end of range (EOR) defects. In the present embodiment, the long range pre-heat has a temperature of about 550° C. for about 180 seconds. Also, in the present embodiment, the second annealing process 290 is a RTA process, utilizing a temperature greater than about 1000° C. and is performed for more than 1.5 seconds. In an embodiment, the second annealing process 290 is a MSA process, utilizing a temperature up to a Si melting point of about 1,400° C. and is performed for a few milliseconds or less, for example for about 0.8 milliseconds to about 100 milliseconds. In the present embodiment, the first annealing process 250 is substantially similar to the second annealing process 290. In alternative embodiments, the first annealing process 250 is different than the second annealing process 290.

During the second annealing process 290, as the substrate 210 recrystallizes, second dislocations 294 are formed in the second stressor region 292. Also, as the substrate 210 recrystallizes, the first dislocations 260 reform within the second stressor region 292. Thus, the first dislocations 260 extends from the first stress region 252 through the second stress region 292. Accordingly, there are bi-layer dislocations within the substrate 210. The reformation of the first dislocations 260 utilize the first dislocations 260, within the first stressor region 252, as a seed. The second dislocations 294 are formed in the 111 direction. The 111 direction has an angle of about 45 to about 65 degrees, the angle being measured with respect to an axis parallel to a surface of the substrate 210. In the present embodiment, the second dislocations 294 have a 111 direction with an angle of about 55 degrees, the angle being measured with respect to an axis parallel to the surface of the substrate 210. The second dislocations 294 may be formed such that they are substantially parallel to the first dislocations 260.

The second dislocations 294 start formation at second pinchoff points 296. The second pinchoff points 296 are formed in the second stressor region 292 at a depth of about 10 to about 150 nanometers, the depth being measured from the surface of the substrate 210. The second pinchoff points 296 have a horizontal buffer 297 and a vertical buffer 298. The horizontal buffer 297 and the vertical buffer 298 are formed according to design specifications and are a function of the second annealing process 290. The second pinchoff points 296 have a horizontal buffer 297 of about 5 to about 20 nanometers and a vertical buffer 298 of about 10 to about 40 nanometers. The second pinchoff points 296 may be formed such that they are not disposed within the channel region. In the present embodiment, the second pinchoff points 296 have a horizontal buffer 297 of about 10 nanometers and a vertical buffer 298 of about 30 nanometers, and are formed at a depth of about 20 nanometers.

Figure 16:
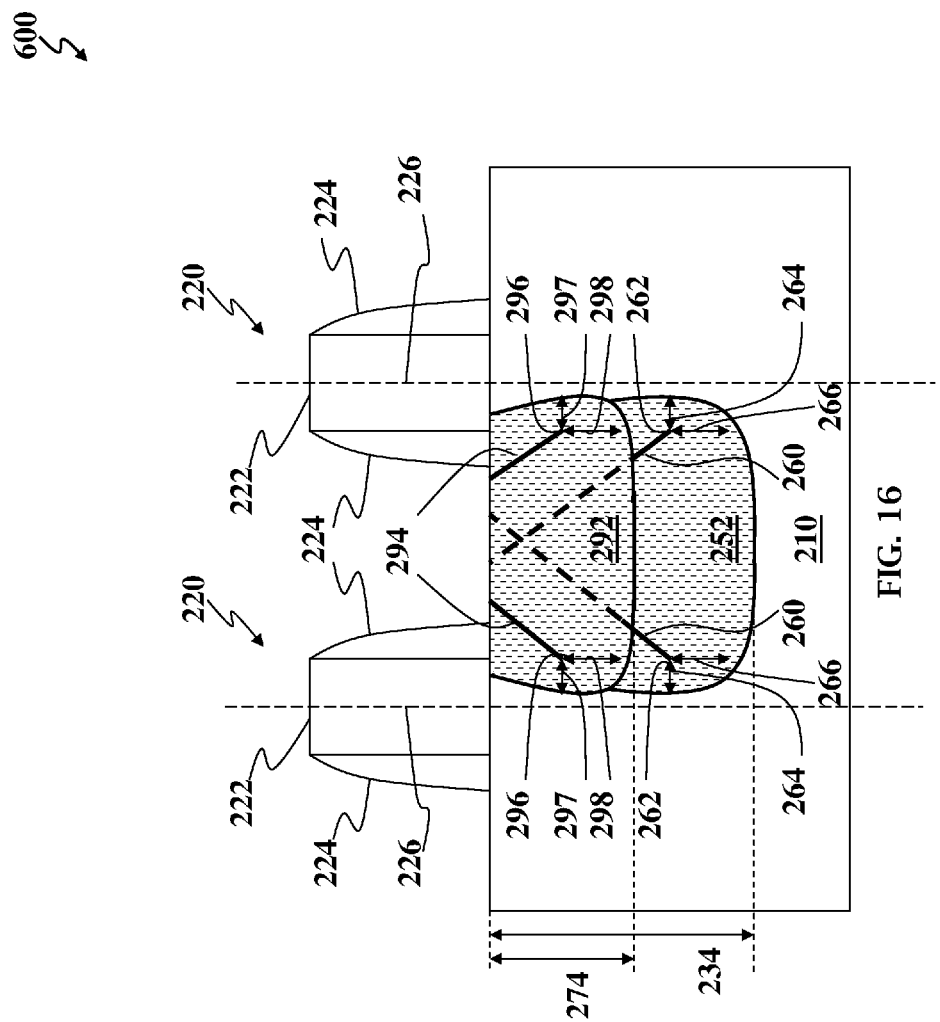

Referring to FIG. 16, the second stress film 280 is removed from the substrate 210. In certain embodiments the gate spacers 224 may also be removed.

A benefit of forming bi-layer dislocations (within stress regions), in accordance with the disclosed embodiments, is that the dislocations are able to be formed consistently within the active region (e.g., source/drain), thereby improving the stress within the channel region. Moreover, the formation of the bi-layer dislocations, in accordance with the disclosed embodiments, have the added benefit of utilizing the patterned photoresist layer or the patterned hard mask layer of current manufacturing process (e.g., LDD or source/drain formation), thereby minimizing cost as no additional photoresist layer or hard mask is required. Thus, the disclosed embodiments provide for increasing the stress in the channel region to improve carrier mobility without adding significant cost to the manufacturing process and/or device. It is understood that different embodiments may have different advantages, and that no particular advantage is necessarily required of any embodiment. In another embodiment, one layer dislocation structure is tuned such that a pair of pinchoff points are close to each other with the corresponding stress being tuned differently. In this case, the SPE temperature is fined tuned such that the dislocations can be extended to the epitaxy layer beyond the pinchoff point.

The semiconductor device 200, 600 may undergo further CMOS or MOS technology processing to form various features known in the art. For example, the method 100, 500 may proceed to form main spacers. Contact features, such as silicide regions, may also be formed. The contact features include silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The contact features can be formed by a process that includes depositing a metal layer, annealing the metal layer such that the metal layer is able to react with silicon to form silicide, and then removing the non-reacted metal layer. An inter-level dielectric (ILD) layer can further be formed on the substrate 210 and a chemical mechanical polishing (CMP) process is further applied to the substrate to planarize the substrate. Further, a contact etch stop layer (CESL) may be formed on top of the gate structure 220 before forming the ILD layer.

In an embodiment, the gate stack 222 remains polysilicon in the final device. In another embodiment, a gate replacement process (or gate last process) is performed, where the polysilicon gate stack 222 is replaced with a metal gate. For example, a metal gate may replace the gate stack (i.e., polysilicon gate stack) of the gate structure 220. The metal gate includes liner layers, work function layers, conductive layers, metal gate layers, fill layers, other suitable layers, and/or combinations thereof. The various layers include any suitable material, such as aluminum, copper, tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other suitable materials, and/or combinations thereof.

Subsequent processing may further form various contacts/vias/lines and multilayer interconnect features (e.g., metal layers and interlayer dielectrics) on the substrate 210, configured to connect the various features or structures of the semiconductor device 200, 600. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

The disclosed semiconductor device 200, 600 may be used in various applications such as digital circuit, imaging sensor devices, a hetero-semiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other type of transistor, including single-gate transistors, double-gate transistors, and other multiple-gate transistors, and may be employed in many different applications, including sensor cells, memory cells, logic cells, and others.

Thus, provided is a method to manufacture a semiconductor device. The method includes providing a substrate having a gate stack. The method further includes performing a first pre-amorphous implantation process on the substrate and forming a first stress film over the substrate. The method also includes performing a first annealing process on the substrate and the first stress film. The method further includes performing a second pre-amorphous implantation process on the annealed substrate, forming a second stress film over the substrate and performing a second annealing process on the substrate and the second stress film.

In some embodiments, the first and second annealing process includes performing a long range pre-heat. In certain embodiments, the first pre-amorphous implantation process includes implanting the substrate with silicon (Si) or germanium (Ge) implant species. In various embodiments, performing the first pre-amorphous implantation process includes utilizing an implantation energy from about 5 KeV to about 40 KeV. In some embodiments, performing the annealing process includes performing a rapid thermal annealing (RTA) process. In further embodiments, performing the RTA process includes utilizing a temperature greater than about 900° C. In certain embodiments, performing the annealing process includes performing a millisecond thermal annealing (MSA) process. In further embodiments, performing the MSA process includes utilizing a temperature greater than about 900° C. In various embodiments, performing the long range pre-heat includes utilizing a temperature of about 200° C. to about 700° C. and wherein the long range pre-heat is performed for about 50 seconds to about 300 seconds.

Also provided is an alternative embodiment of a method for manufacturing a semiconductor device. The method includes forming a gate structure over a substrate and forming a first amorphized region in the substrate. The method also includes depositing a first stress film over the first amorphized region and performing a first annealing process on the first stress film such that the first amorphized region re-crystallizes and forms a first stressor region. The method further includes removing the first stress film, forming a second amorphized region in the substrate, and depositing a second stress film over the second amorphized region. The method also includes performing a second annealing process on the second stress film such that the second amorphized region recrystallizes and forms a second stressor region and removing the second stress film.

In some embodiments the method may further comprise performing a long range pre-heat. In certain embodiments performing the long range pre-heat includes utilizing a temperature from about 200° C. to about 700° C. In various embodiments, performing the first and second annealing process includes utilizing a temperature from about 900° C. to about 1,400° C. In further embodiments, the first amorphized region is formed deeper within the substrate than the second amorphized region.

Also provided is a semiconductor device. The semiconductor device includes a semiconductor substrate and a gate structure disposed over a channel region of the semiconductor substrate. The semiconductor device further includes a first stress region disposed in the semiconductor substrate. The first stress region includes a first dislocation. The semiconductor device further includes a second stress region disposed in the semiconductor substrate and overlying the first stress region. The second stress region includes a second dislocation. The first stress region of the semiconductor device is deeper within the semiconductor substrate than the second stress region, and the first dislocation and the second dislocation are formed in the 111 direction.

In some embodiments, the 111 direction has an angle of about 45 to about 65 degrees, the angle being measured with respect to an axis parallel to a surface of the semiconductor substrate. In various embodiments, the first dislocation extends from the first stress region through the second stress region. In certain embodiments, the first dislocation has a first pinchoff point that is disposed in the semiconductor substrate at a depth less than about 100 nanometers, and the second dislocation has a second pinchoff point that is disposed in the semiconductor substrate at a depth less than about 50 nanometers, the depth being measured from the surface of the semiconductor substrate. In further embodiments, the first pinchoff point and the second pinchoff point are not disposed within the channel region. In various embodiments, the first stress region and the second stress region do not extend beyond a center line of the gate structure within the semiconductor substrate.

The above disclosure provides many different embodiments, or examples, for implementing different features of the invention. Specific examples of components and arrangements are described above to simplify the present disclosure. These are, of course, merely examples and are not intended to be limiting. Accordingly, the components disclosed herein may be arranged, combined, or configured in ways different from the exemplary embodiments shown herein without departing from the scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    providing a substrate including a gate stack having spacers;
    performing a first implantation process on the substrate including the gate stack and spacers such that the substrate is amorphized;
    forming a first stress film over the amorphized substrate including the gate stack and spacers;
    performing a first annealing process on the amorphized substrate and the first stress film such that a first stress region is formed within the substrate;
    after forming the first stress region, removing the first stress film and the spacers;
    performing a second implantation process on the substrate such that a top portion of the first stress region is amorphized;
    forming a second stress film over the amorphized top portion of the first stress region; and
    performing a second annealing process on the amorphized top portion of the first stress region and the second stress film such that a second stress region is formed over the first stress region within the substrate.

2. The method of claim 1 further wherein the first and second annealing process includes performing a long range pre-heat.

3. The method of claim 1 wherein performing the first implantation process includes implanting the substrate with silicon (Si) or germanium (Ge) implant species.

4. The method of claim 1 wherein performing the first implantation process includes utilizing an implantation energy from about 5 KeV to about 40 KeV.

5. The method of claim 1 wherein performing the annealing process includes performing a rapid thermal annealing (RTA) process.

6. The method of claim 5 wherein performing the RTA process includes utilizing a temperature greater than about 900° C.

7. The method of claim 1 wherein performing the annealing process includes performing a millisecond thermal annealing (MSA) process.

8. The method of claim 7 wherein performing the MSA process includes utilizing a temperature greater than about 900° C.

9. The method of claim 2 wherein performing the long range pre-heat includes utilizing a temperature of about 200° C. to about 700° C. and wherein the long range pre-heat is performed for about 50 seconds to about 300 seconds.

* * * * *